(12) United States Patent
Koo et al.

(10) Patent No.: US 6,864,130 B2
(45) Date of Patent: Mar. 8, 2005

(54) CRYSTALLIZATION METHOD OF SILICON THIN FILM, THIN FILM TRANSISTOR MANUFACTURED USING THE METHOD, AND FLAT PANEL DISPLAY INCLUDING THE THIN FILM TRANSISTOR

(75) Inventors: Jae-Bon Koo, Kyungki-do (KR); Ji-Yong Park, Kyungki-do (KR); Sang-Il Park, Seoul (KR)

(73) Assignee: Samsung SDI Co., Ltd., Suwon-Si (KR)

( * ) Notice: Subject to any disclaimer, the term of this patent is extended or adjusted under 35 U.S.C. 154(b) by 67 days.

(21) Appl. No.: 10/624,636

(22) Filed: Jul. 23, 2003

(65) Prior Publication Data

US 2004/0125265 A1 Jul. 1, 2004

(30) Foreign Application Priority Data

Aug. 3, 2002 (KR) .................. 10-2002-0045955

(51) Int. Cl.⁷ .................. H01L 21/00; H01L 21/84
(52) U.S. Cl. .................. 438/166; 349/56; 349/43; 349/106; 257/59; 257/347
(58) Field of Search .................. 438/166; 349/56, 349/43, 106; 257/59, 347

(56) References Cited

U.S. PATENT DOCUMENTS

| 5,827,409 A | 10/1998 | Iwata et al. |
| 6,274,888 B1 * | 8/2001 | Suzuki et al. .................. 257/72 |

* cited by examiner

Primary Examiner—Craig A. Thompson
(74) Attorney, Agent, or Firm—Stein, McEwen & Bui, LLP

(57) ABSTRACT

A crystallization method includes forming a black matrix layer that absorbs external light on an insulating substrate, wherein an upper region of the black matrix layer comprises a catalyst for silicon crystallization, patterning the black matrix layer, forming an amorphous silicon thin film on the insulating substrate and the black matrix layer, and thermally processing the amorphous silicon thin film for crystallization. A thin film transistor formed using the crystallization method has improved properties as a continuous metal-induced crystallization region and a metal-induced lateral crystallization region are formed therein without a definite boundary.

36 Claims, 6 Drawing Sheets

CRYSTALLIZATION METHOD OF SILICON THIN FILM, THIN FILM TRANSISTOR MANUFACTURED USING THE METHOD, AND FLAT PANEL DISPLAY INCLUDING THE THIN FILM TRANSISTOR

CROSS-REFERENCE TO RELATED APPLICATION

This application claims the benefit of Korean Patent Application No. 2002-45955, filed on Aug. 3, 2002 in the Korean Intellectual Property Office, the disclosure of which is incorporated herein by reference.

BACKGROUND OF THE INVENTION

1. Field of the Invention

The present invention relates to a crystallization method of an amorphous silicon thin film, and more particularly, to a method of forming a thin film transistor (TFT), which is applied to flat panel displays, such as liquid crystal displays (LCDs) and light emitting displays (LEDs), 3-dimensional very large-scale integrated (VSLI) semiconductor devices, etc., using the crystallization method, a TFT manufactured using the method, and a flat panel display including the TFT.

2. Description of the Related Art

Generally, an amorphous silicon thin film transistor (a-Si TFT) used in a flat panel display, such as a liquid crystal display (LCD), an organic or inorganic light emitting display (OLED or LED), etc., uses amorphous silicon for its semiconductor active layer including a source, a drain, and a channel, and provides a low electron mobility of 1 $cm^2/Vs$ or less. Accordingly, such an a-Si TFT has been recently replaced with a polycrystalline silicon TFT (poly-Si TFT). A poly-Si TFT provides greater electron mobility than the a-Si TFT and is stable to light irradiation. Thus, a poly-Si TFT can be used as a driving and/or switching transistor of active matrix LCDs or active matrix organic LEDs.

Typically, the poly-Si TFT is manufactured by directly depositing polycrystalline silicon, or by crystallizing amorphous silicon after a deposition thereof.

Examples of a method of directly depositing polycrystalline silicon include a chemical vapor deposition (CVD), a photo CVD, a hydrogen radical (HR) CVD, an electron cyclotron resonance (ECR) CVD, a plasma enhanced (PE) CVD, and a low pressure (LP) CVD.

Examples of a method of crystallizing amorphous silicon after a deposition include a solid phase crystallization (SPC), an excimer laser crystallization (ELC), a sequential lateral solidification (SLS), a metal induced crystallization (MIC), and a metal induced lateral crystallization (MILC).

However, the SPC is impractical to apply because it requires a long duration of a high temperature process at 600° C. or greater. While the ELC has an advantage of low-temperature crystallization, the intensity uniformity of a laser beam for crystallization, which is diverged by an optical system, is poor. On the other hand, the SLS involves irradiating a laser beam onto an amorphous silicon layer through a chevron pattern mask to form a localized region of crystallized polysilicon and requires a precise control of the laser irradiation. Moreover, it is difficult to reproduce such a polysilicon thin film having uniform characteristics with the SLS. The MIC has an advantage of low-temperature crystallization because a metal thin film acting as a catalyst for crystallization is deposited on a surface of an amorphous silicon layer prior to crystallization of the amorphous silicon layer. However, a polysilicon layer formed by the MIC contains small, disordered crystals, and the metal that remains in the polysilicon layer degrades the properties of a thin film transistor manufactured from it.

Recently, a MILC has been suggested as an alternative to resolve the problems arising with the above-described conventional amorphous silicon crystallization methods. The MILC induces lateral, sequential crystallization by reacting a metal with silicon to form silicide. In MILC, the metal used for crystallization of an amorphous silicon layer hardly remains in a semiconductor active layer, and the resulting crystals have a small size and are highly ordered. Therefore, a current leakage due to a remaining metallic component and other electrical degradations do not occur. Moreover, crystallization by the MILC can be induced at a relatively low temperature of 300–500° C.

FIGS. 1A to 1D illustrate a method of forming a polysilicon layer using such a conventional MILC method.

Referring to FIG. 1A, a buffer layer 2 is formed on a transparent substrate 1 using $SiO_x$, and an amorphous silicon layer 3 is deposited on the buffer layer 2. An insulating layer 4 is deposited on the amorphous silicon layer 3, and a photosensitive layer 5, for example, a photoresist layer, having a predetermined pattern is formed. Next, as illustrated in FIG. 1B, the insulating layer 4 on the amorphous silicon layer 3 is etched into a predetermined pattern using the photosensitive layer 5, and a nickel (Ni) thin film 6 is deposited thereon as a catalyst for crystallization. Thereafter, a thermal process is carried out. As a result, as illustrate in FIG. 1C, an MIC region 7 is formed in a region A of the amorphous silicon layer 3, from which the insulating layer 4 is removed, as a result of a metal induced crystallization, and an MILC layer 8 is formed in a region B in which the insulating layer 4 remains unetched, as a result of a lateral crystallization from the MIC region 7. Next, the insulating layer 4 is removed from the MILC region 8 to provide a polysilicon thin film, as illustrated in FIG. 1D.

Where such a MILC is applied to form a TFT, after a formation of a gate dielectric layer and a gate electrode on an amorphous silicon thin film, a Ni thin film is formed thereon and thermally processed for crystallization. Alternatively, after a formation of a gate dielectric layer and a gate electrode, a photoresist is applied to cover the gate dielectric layer, the gate electrode, and partially cover a source region and a drain region, and a Ni thin film is formed thereon. Next, the photoresist is removed for crystallization through a thermal process. In the above cases, a boundary of resulting MIC and MILC regions, which have different crystalline structures, is not aligned with a source/channel boundary and a drain/channel boundary. Accordingly, characteristics of the channel region are negatively enhanced.

Furthermore, as described above, the conventional MILC requires lengthy operations including a photoresist layer formation for a larger MILC region and a crystallization catalyst deposition, thereby complicating the manufacture of a TFT.

SUMMARY OF THE INVENTION

Accordingly, it is an aspect of the present invention to provide a crystallization method of an amorphous silicon thin film using a black matrix, that is simplified compared to a conventional crystallization method.

Another aspect of the present invention is to provide a thin film transistor (TFT) with enhanced properties, in which a metal-induced crystallization (MIC) region and a metal-induced lateral crystallization (MILC) region are formed to be continuous without a definite boundary.

Yet another aspect of the present invention is to provide a crystallization method of an amorphous silicon thin layer, which involves fewer processing operations, compared to a conventional crystallization method, by utilizing a simultaneous black matrix layer formation and crystallization.

Additional aspects and/or advantages of the invention will be set forth in part in the description which follows and, in part, will be obvious from the description, or may be learned by practice of the invention.

To achieve the above and/or other aspects of the present invention, there is provided a crystallization method of an amorphous silicon thin film, the method comprising forming a black matrix layer to absorb external light on a substrate, an upper region of the black matrix layer having a catalyst for crystallization, patterning the black matrix layer, forming the amorphous silicon thin film on the substrate and the black matrix layer and thermally processing the amorphous silicon thin film for crystallization.

The forming of the black matrix layer may comprise forming a functional thin film having a transparent first component in a lower region thereof facing the substrate and a metallic second component in an upper region thereof. The forming of the functional thin film may include forming the transparent first component having a gradually decreasing concentration and the metallic second component having a gradually increasing concentration, with increasing distance from the insulating substrate.

The transparent first component may comprise at least one selected from the group consisting of $SiO_x$ where $x \geq 1$, $SiN_x$ where $x \geq 1$, $MgF_2$, $CaF_2$, $Al_2O_3$, and $SnO_2$, which are transparent insulating materials, and the group consisting of ITO, IZO, ZnO, and $In_2O_3$, which are transparent conductive materials. The metallic second component may comprise at least one metal selected from the group consisting of Fe, Co, V, Ti, Al, Ag, Si, Ge, Y, Zn, Zr, W, Ta, Cu, and Pt.

The forming of the black matrix may comprise forming a functional thin film having a first thin film of $CrO_x$, where $x \geq 1$, on the substrate, and forming a second thin film formed of Cr on the first thin film.

The black matrix layer may comprise a $CrO_x$ thin film where $x \geq 1$, or a Cr thin film.

The black matrix layer may be for a flat panel display, and the patterning of the black matrix layer may comprise patterning the black matrix layer simultaneously with a patterning operation to expose a pixel region of the flat panel display.

The catalyst for silicon crystallization may comprise at least one selected from the group consisting of Ni, Pd, Au, Sn, Sb, Cr, Mo, Tr, Ru, Rh, Fe, Co, V, Ti, Al, Ag, Cu, and Pt.

To achieve the above and/or other aspects of the present invention, there is provided another crystallization method of an amorphous silicon thin film, the method comprising forming a black matrix layer to absorb external light on a substrate, forming a crystallization thin film having a catalyst for crystallization on the black matrix layer, patterning the black matrix layer and the crystallization thin film, forming the amorphous silicon thin film on the insulating substrate and the patterned crystallization thin film, and thermally processing the amorphous silicon thin film for crystallization.

The forming of the black matrix layer may comprise forming a functional thin film having a transparent first component in a lower region thereof facing the substrate and a metallic second component in an upper region thereof. The forming of the functional thin film may include forming the transparent first component having a gradually decreasing concentration and the metallic second component having a gradually increasing concentration, with increasing distance from the substrate.

The transparent first component may comprise at least one selected from the group consisting of $SiO_x$ where $x \geq 1$, $SiN_x$ where $x \geq 1$, $MgF_2$, $CaF_2$, $Al_2O_3$, and $SnO_2$, which are transparent insulating materials, and the group consisting of ITO, IZO, ZnO, and $In_2O_3$, which are transparent conductive materials. The metallic second component may comprise at least one metal selected from the group consisting of Fe, Co, V, Ti, Al, Ag, Si, Ge, Y, Zn, Zr, W, Ta, Cu, and Pt.

The black matrix layer may comprise a $CrO_x$ thin film where $x \geq 1$, or a Cr thin film.

The black matrix layer may be a functional thin film comprising a first thin film formed of $CrO_x$, where $x \geq 1$, on the insulating substrate and a second thin film formed of Cr on the first thin film.

The black matrix layer may be for a flat panel display, and the patterning of the black matrix layer may comprise patterning the black matrix layer simultaneously with a patterning operation to expose a pixel region of the flat panel display.

The catalyst for silicon crystallization may comprise at least one selected from the group consisting of Ni, Pd, Au, Sn, Sb, Cr, Mo, Tr, Ru, Rh, Fe, Co, V, Ti, Al, Ag, Cu, and Pt.

To achieve the above and/or other aspects of the present invention, there is provided a thin film transistor comprising a substrate and a semiconductor active layer having channel, source and drain regions formed on the substrate, wherein the source and drain regions are formed at respective sides of the channel region, and at least the channel region is formed as a metal-induced lateral crystallization (MILC) region. The thin film transistor further comprises a black matrix layer interposed between the substrate and at least the source region and the drain region of the semiconductor active layer, wherein an upper region of the black matrix layer includes a catalyst for crystallization, a gate dielectric layer formed on the channel region, and a gate electrode formed on the gate dielectric layer.

The source and drain regions may be formed by a doping method utilizing a high concentration of impurity ions.

The black matrix layer may slope downward from the source region and the drain region toward the channel region.

Each of the source region and the drain region may include a combined region facing the channel region and a metal-induced crystallization (MIC) region, and the combined region may include a portion of the MILC region and a portion of the MIC region.

The thin film transistor may further comprise a silicon crystallization catalyst thin film comprising at least one metal selected from the group consisting of Ni, Pd, Au, Sn, Sb, Cr, Mo, Tr, Ru, Rh, Fe, Co, V, Ti, Al, Ag, Cu, and Pt, which is provided between the black matrix layer and the source and drain regions.

To achieve the above and/or other aspects of the present invention, there is provided a flat panel display comprising an insulating substrate, a pixel region including pixels arranged in a matrix on the insulating substrate, and at least one thin film transistor near the pixel region. The at least one thin film transistor comprises a semiconductor active layer having channel, source and drain regions formed on the insulating substrate, the source and drain regions formed at respective sides of the channel region, wherein at least the channel region is formed as a metal-induced lateral crystallization (MILC) region, a gate dielectric layer formed above the channel region, a gate electrode formed on the gate dielectric layer, and a black matrix layer interposed between the insulating substrate and the gate dielectric layer, the black matrix layer having an opening which exposes at least the channel region between the source region and the drain region of the semiconductor active layer and an opening which exposes the pixel region.

The thin film transistor may further comprise an interlayer insulating layer formed on the gate electrode and the gate dielectric layer, source and drain electrodes which are formed on the interlayer insulating layer and electrically connected to the source and drain regions, respectively, of the semiconductor active layer, and a passivation layer formed on the interlayer insulating layer, the source electrode, and the drain electrode so as to connect a pixel electrode of the pixel region to the drain electrode.

The source and drain regions may be formed by a doping method utilizing a high concentration of impurity ions.

The black matrix layer may slope downward from the source region and the drain region toward the channel region.

Each of the source region and the drain region may include a combined region facing the channel region and a metal-induced crystallization (MIC) region, and the combined region may include a portion of the MILC region and a portion of the MIC region.

An upper region of the black matrix layer facing the semiconductor active layer may comprise at least one metal selected from the group consisting of Ni, Pd, Au, Sn, Sb, Cr, Mo, Tr, Ru, Rh, Fe, Co, V, Ti, Al, Ag, Cu, and Pt.

The flat panel display may further comprise a silicon crystallization catalyst thin film comprising at least one metal selected from the group consisting of Ni, Pd, Au, Sn, Sb, Cr, Mo, Tr, Ru, Rh, Fe, Co, V, Ti, Al, Ag, Cu, and Pt, which is provided between the black matrix layer and the source and drain regions of the semiconductor active layer.

BRIEF DESCRIPTION OF THE DRAWINGS

These and/or other aspects and advantages of the invention will become apparent and more readily appreciated from the following description of the preferred embodiments taken in conjunction with the accompanying drawings in which.

DETAILED DESCRIPTION OF THE PREFERRED EMBODIMENTS

Figure 1A:
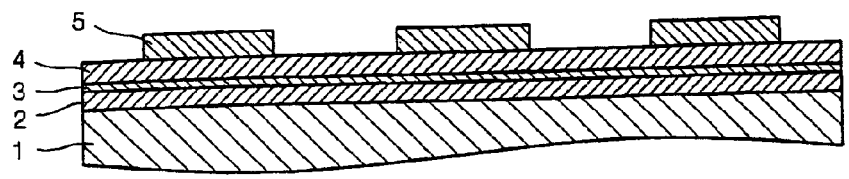
FIGS. 1A through 1D are views illustrating a method of forming a polysilicon layer using a conventional metal-induced lateral crystallization method.
Figure 1B:
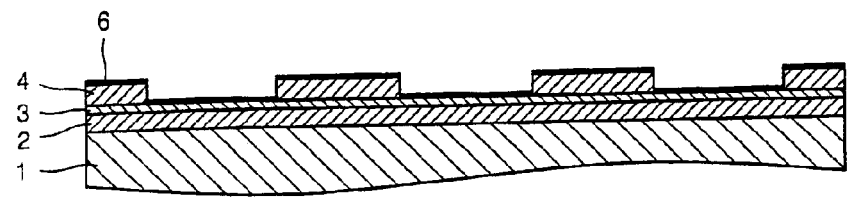
Figure 1C:
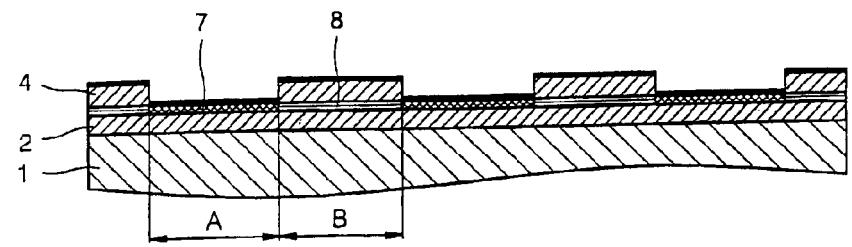
Figure 1D:
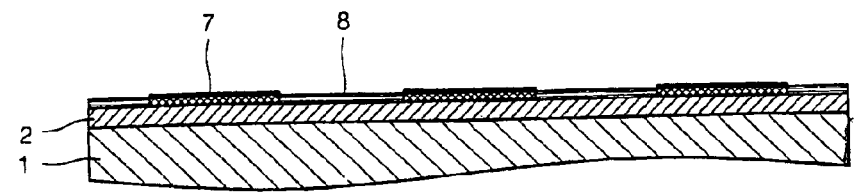

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
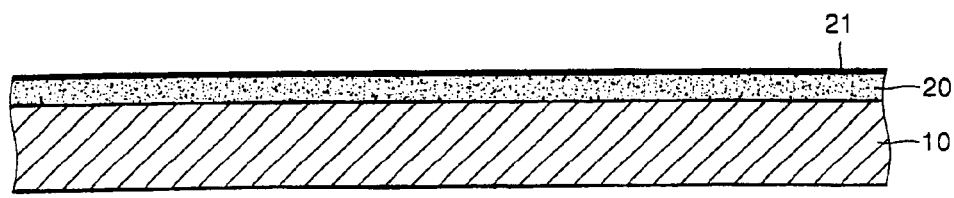
FIGS. 2 through 4 are sectional views illustrating a crystallization method of an amorphous silicon thin film according to an embodiment of the present invention.
Figure 3:
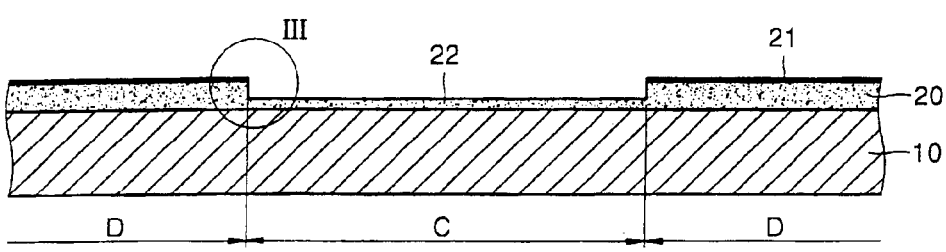
Figure 4:
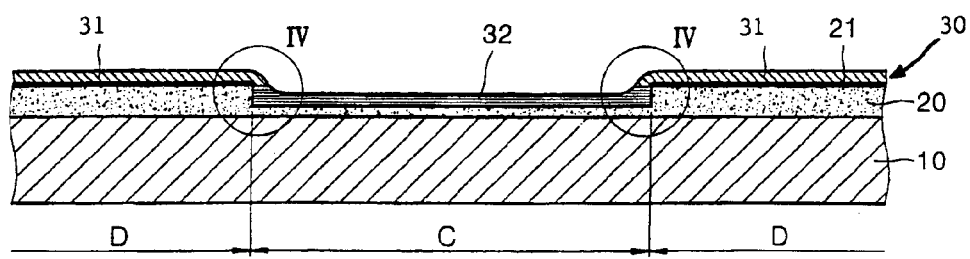

FIGS. 2 through 4 illustrate a crystallization method of an amorphous silicon thin film according to an embodiment of the present invention.

Referring to FIG. 2, a black matrix layer is formed on an insulating substrate 10. This black matrix layer may be a functional thin film 20 having a catalyst for silicon crystallization in its upper region. The functional thin film 20 comprises a transparent first component in a lower region close to the substrate 10 and a metallic second component in an upper region thereof, with a concentration gradient profile in a direction of its thickness. Therefore, the functional thin film 20 absorbs external light incident on a bottom of the insulating substrate 10. Accordingly, the functional thin film 20 can be used as an external light absorbing black matrix in a display.

Figure 7:
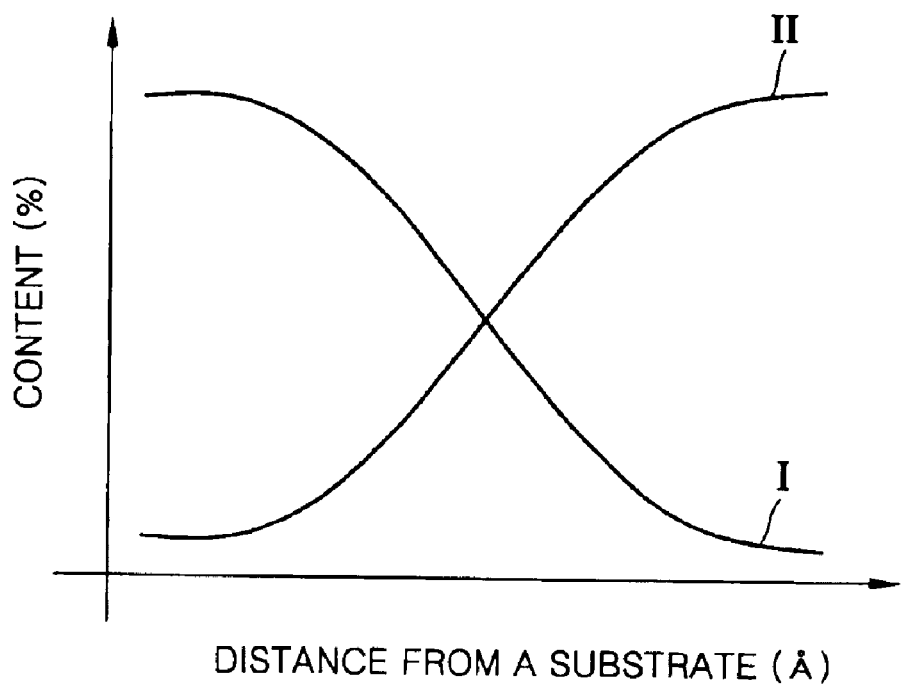
FIG. 7 is a graph of a concentration gradient profile of a functional thin film of FIG. 2.

In particular, the functional thin film 20 has a concentration gradient profile, as illustrated in FIG. 7, in which a concentration of the transparent first component I decreases and a concentration of the metallic second component II increases in a direction of the thickness, with increasing distance from the insulating substrate 10. The transparent first component of the functional thin film 20 may comprise at least one selected from the group consisting of $SiO_x$ ($x \geq 1$), $SiN_x$ ($x \geq 1$), $MgF_2$, $CaF_2$, $Al_2O_3$, and $SnO_2$, which are transparent insulating materials and the group consisting of $In_2O_3$, ITO (Indium tin oxide), IZO (indium zinc oxide), and ZnO, which are transparent conductive materials. The second component of the functional thin film 20 may comprise at least one metal selected from the group consisting of Fe, Co, V, Ti, Al, Ag, Si, Ge, Y, Zn, Zr, W, Ta, Cu, and Pt.

The concentration gradient profile of the functional thin film 20, having a decreasing concentration of the transparent first component and an increasing concentration of the metallic second component in the direction of the thickness, with increasing distance from the insulating substrate 10, enhances the ability of the functional thin film 20 to absorb external light, so as to, for example, reduce the reflectance of light at the functional thin film 20.

A smaller difference in refractive index between substrate 10 and the thin film 20 is more advantageous in reducing the reflectance at the thin film. Reflectance does not occur at the thin film 20 where the substrate 10 and the thin film 20 have an equal refractive index.

Figure 8:
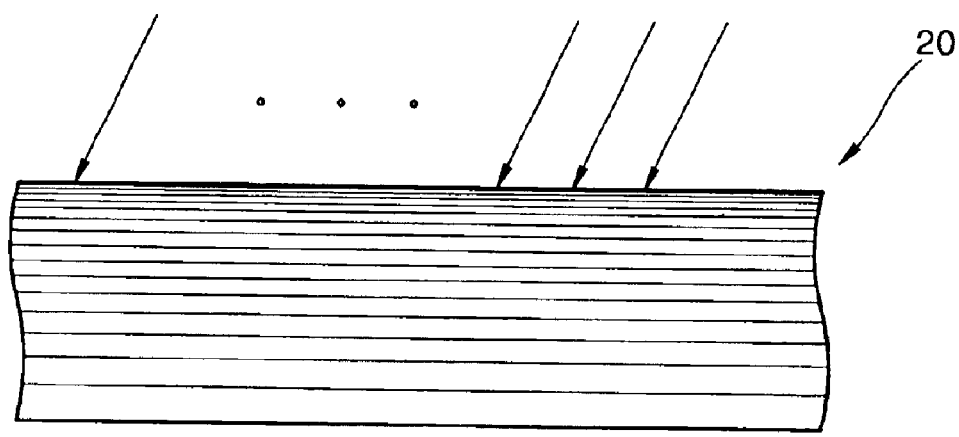
FIG. 8 is an enlarged sectional view of the functional thin film of FIG. 2.

Accordingly, a first component of the thin film 20 used in the present invention, for a region adjacent to the substrate 10, may be a transparent insulating material having a similar refractive index to the substrate. Based on this principle, multiple thin films can be stacked upon one another for the functional thin film 20 in the order of their refractive indices, as illustrated in FIG. 8, so as to have a light absorption coefficient of the functional thin film 20 increasingly varies in the direction of its thickness. As a result, the light transmission gradually decreases and is finally blocked at a predetermined thickness. Therefore, this functional thin film 20 can be used as a black matrix for a display device.

Suitable transparent insulating materials for the first component of the functional thin film 20 include $SiO_x$ ($x \geq 1$), $SiN_x$ ($x \geq 1$), $MgF_2$, $CaF_2$, $Al_2O_3$, and $SnO_2$, because these materials have similar properties to a glass substrate, for example, in refractive index. Suitable metallic materials for the second component of the functional thin film 20 include Fe, Co, V, Ti, Al, Ag, Si, Ge, Y, Zn, Zr, W, Ta, Cu and Pt, which may be used in combination, because these materials have a large light absorption coefficient. It is understood that transparent conductive materials, including $In_2O_3$, ITO, IZO, and ZnO can be used for the first component. Furthermore, the second component in an upper region of the functional thin film 20 may further comprise a catalyst for amorphous silicon crystallization in a subsequent process. At least one metal selected from the group consisting of Ni, Pd, Au, Sn, Sb, Cr, Mo, Tr, Ru, Rh, Fe, Co, V, Ti, Al, Ag, Cu, and Pt may be used as the catalyst for amorphous silicon crystallization.

The functional thin film 20 may be formed to vary its electrical conductivity, in addition to its refractive index, in the direction of its thickness, to maximize the utilization efficiency. The amount of metal in the functional thin film 20 may gradually increases in the direction of its thickness with increasing distance from the substrate 10 so as to have the functional thin film 20 with an increasing electrical conductivity and a decreasing external light reflectance away from the substrate 10. This optical structure of the function thin film 20 having a large electrical conductivity can be applied to an electromagnetic wave shield or an external light absorbing layer of a display device to prevent a charge accumulation. In addition, a metallic second component of the functional thin film 20 may serve as a catalyst for amorphous silicon crystallization.

The functional thin film 20 may be formed by thin film formation methods known or to be known, for example, by a sputtering, a vacuum deposition, a physical vapor deposition (PVD), or a chemical vapor deposition (CVD) method.

According to an embodiment of the present invention, for example, a transparent material for a first component of the functional thin film 20 may be deposited by a radio frequency (RF) magnetron sputtering, and a second component including metal may be deposited by a RF or a DC sputtering. An apparatus for sputtering may comprise a vacuum chamber equipped with a pumping system, a magnetron cathode and targets (for the first and second components) placed in the vacuum chamber, and a gas supply system to supply argon (Ar) gas to emit magnetrons.

That is, a first target containing a transparent insulating material is hit by applying RF power to deposit SiO on the substrate 10. RF or DC power applied to a second target containing a metal is raised while the RF power applied to the first target is lowered. As a result, the functional thin film 20 comprising first and second components with opposite concentration gradient profiles is formed on the substrate.

Such a functional thin film 20 can also be formed by a vacuum thermal deposition. In this case, a deposition boat containing a mixture of the first and second components is heated by increasing a voltage applied to the deposition boat. As the deposition temperature rises with time, the first component begins to be deposited, both of the first and second components are deposited at a greater temperature until all of the first component is exhausted, and only the metallic second component is deposited at a much greater temperature. As a result, a functional thin film having a gradually decreasing concentration of the first component I and a gradually increasing concentration of the second component II, with increasing distance from the substrate 10, as illustrated in FIG. 7, is formed.

In the functional thin film 20, as illustrated in FIG. 2, a larger amount of the first component is incorporated in a region close to the substrate 10, and a larger amount of the second component is incorporated in an upper region away from the substrate 10. Since the metallic second component in the upper region of the functional thin film 20 includes at least a catalyst for silicon crystallization, subsequent amorphous silicon crystallization is facilitated by the catalyst. According to an aspect of the present invention, an additional crystallization thin film 21 formed of a catalytic material may further be provided to facilitate amorphous silicon crystallization, as shown in FIG. 2. According to another aspect, the crystallization thin film 21 may be formed on a functional thin film that does not contain a silicon crystallization catalyst.

After forming the functional thin film 20, the functional thin film 20 is patterned, as illustrated in FIG. 3. In the case of further forming the crystallization thin film 21 on the functional thin film 20, as described above, the crystallization thin film 21 is patterned together with the functional thin film 20 into the same pattern.

Figure 5:
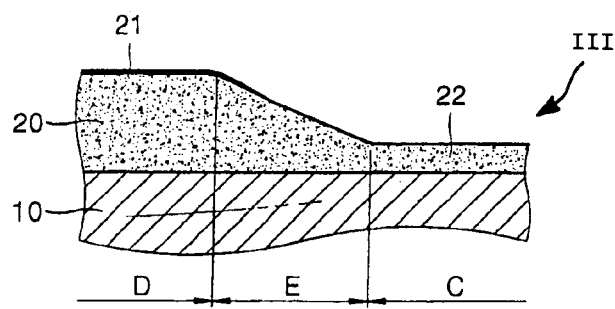
FIG. 5 is an enlarged sectional view of region III of FIG. 3.

The functional thin film 20 can be patterned by known or to be known patterning methods, for example, photolithography methods. Since the functional thin film 20 has a concentration gradient profile in the direction of its thickness, the patterned functional thin film 20 has a sloping region. This is considered to be attributed to a difference in etch rate between the insulating first component and the metallic second component in an etchant. The length of the sloping region is about four to five times greater than the thickness of the functional thin film 20. For example, where the functional thin film 20 has a thickness of 3000 Å, a sloping region has a length of about 1–1.5 $\mu$m. In other words, a boundary region III of FIG. 3 between patterned (C) and non-patterned (D) regions of the functional thin film 20 is sloped downward, as illustrated in FIG. 5.

That is, as a result of patterning the functional thin film 20, an intermediate region E is formed between the non-patterned (non-etched) region D and the patterned (etched) region C, wherein the intermediate region E is more etched in a region close to an upper layer of the thin film 20.

In the patterned region C of the functional thin film 20, an upper catalytic region of the functional thin film 20 is fully etched, resulting in a first thin film 22 with only the first component remaining as a buffer layer. In the intermediate region E, the second component remains with a decreasing concentration profile from the non-pattered region D toward the patterned region C. According to still another aspect of the present invention, instead of using the first thin film 22, which is the lowermost portion having only the first component of the function thin film 20 that remained after the patterning, as a buffer layer, a buffer layer comprising $SiO_x$ ($x \geq 1$) or $SiN_x$ ($x \geq 1$) may further be formed on the substrate 10, prior to the formation of the functional thin film 20, so as to prevent contamination by alkali metal diffused from the substrate 10.

In the case of forming the crystallization thin film 21 on the functional thin film 20, as a result of patterning, only a portion of the crystallization thin film 21 remains in a region of the intermediate region E close to the non-patterned region D.

After the patterning of the functional thin film 20, an amorphous silicon thin film 30 is deposited on the resulting structure and subjected to a thermal process for crystallization. The thermal processing conditions for crystallization may be varied depending on a channel size of a desired thin film transistor. A thermal process for crystallization may be performed at 500° C. for 10 hours at a growing rate of 3 μm/hour where Ni is used as a catalyst for amorphous silicon crystallization.

As a result of the thermal process, as illustrated in FIG. 4, a metal-induced crystallization (MIC) region 31 is formed on the non-patterned region D through crystallization directly induced by the catalyst contained in the upper, second component region of the functional thin film 20, or by the crystallization thin film 21 separately formed on the functional thin film 20. A metal-induced lateral crystallization (MILC) region 32 is formed on the pattern region C, from which the upper, second component region of the functional thin film 20 or the crystallization thin film 21 has been removed, through lateral crystallization from the MIC region 31.

Figure 6:
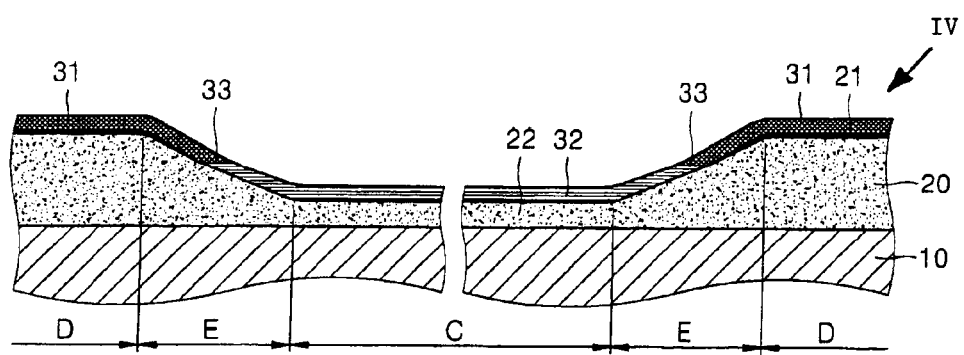
FIG. 6 is an enlarged sectional view of region IV of FIG. 4.

In a boundary region IV between the MIC region 31 and the MILC region 32, which corresponds to the sloping region of the functional thin film 20, both the MIC region 31 and the MILC region 32 are present, as indicated by reference numeral 33 in FIG. 6. In particular, in a region of the intermediate region E close to the non-patterned region D, the amorphous silicon thin film 30 is directly crystallized into the MIC region 31 because of the crystallization catalyst that remains in the upper region of the functional thin film 20. In a region of the intermediate region E close to the patterned region C, the MILC 32 region is formed through lateral crystallization from the MIC region 31. As a result, the MIC and MILC combined region 33 is formed in the intermediate region E. In addition, since the functional thin film 20 includes the first and second components with concentration gradient profiles in the direction of its thickness, the MILC region 32 is formed gradually through lateral crystallization from the MIC region 31 without a definite boundary between the two regions.

After the crystallization of the amorphous silicon thin film into a poly-Si thin film using the above-described method, a thin film transistor (TFT) is manufactured from the poly-Si thin film.

A TFT according to an embodiment of the present invention comprises a semiconductor active layer, a gate dielectric layer formed on the semiconductor active layer, and a gate electrode formed on the gate dielectric layer. The semiconductor active layer includes a channel region, and source and drain regions which are formed at respective sides of the channel region by doping a high concentration of impurity ions.

The semiconductor active layer is formed of a poly-Si thin film of the present invention. Referring to FIG. 6, the MILC region 32 in the patterned region C forms a channel region, and a combination of the MIC region 31 in the non-patterned region D and the MIC and MILC combined region 33 in the intermediate region E forms the source region and the drain region at either side of the channel region. Accordingly, an external light absorbing layer, i.e., a black matrix, which is formed of the functional thin film 20 remaining in the non-pattern region D and the intermediate region E, exists between the substrate 10 and at least source and drain regions of the semiconductor active layer. The functional thin film 20 still remains between the substrate 10 and the channel region. However, the functional thin film 20 remaining underneath the channel region, which corresponds to the MILC region 32, contains only the transparent first component, and therefore, cannot serve as a light absorbing black matrix.

After the formation of the semiconductor active layer from the poly-Si thin film, a gate dielectric layer and a gate electrode are sequentially formed on the semiconductor active layer. Next, the source region and the drain region are doped with a high concentration of impurity ions.

After the formation of such a TFT, an interlayer insulating layer may further be formed on the gate electrode. In which case, source and drain electrodes may be formed via contact holes formed in the interlayer insulating layer, a passivation layer is formed to cover the source and drain electrodes, and a pixel electrode that is electrically connected to the drain electrode may be formed. Furthermore, a planarization layer may be formed on the resulting structure. Source and drain electrodes may be formed in various shapes without limitation to this embodiment.

Various methods can be applied to form such a TFT from a poly-Si thin film formed by a method according to the present invention, depending on the characteristics of a desired display device.

In manufacturing a TFT for a backward emission display, patterning a black matrix for an opening exposing pixels can be performed simultaneously with patterning the functional thin film 20 to form a region to be the poly-Si MILC region, i.e., a channel region of a semiconductor active layer, thereby reducing the number of processing operations.

A TFT manufactured according to the present invention as described above can be used in various flat panel display devices, such as LCDs and organic and inorganic LEDs.

Figure 9:
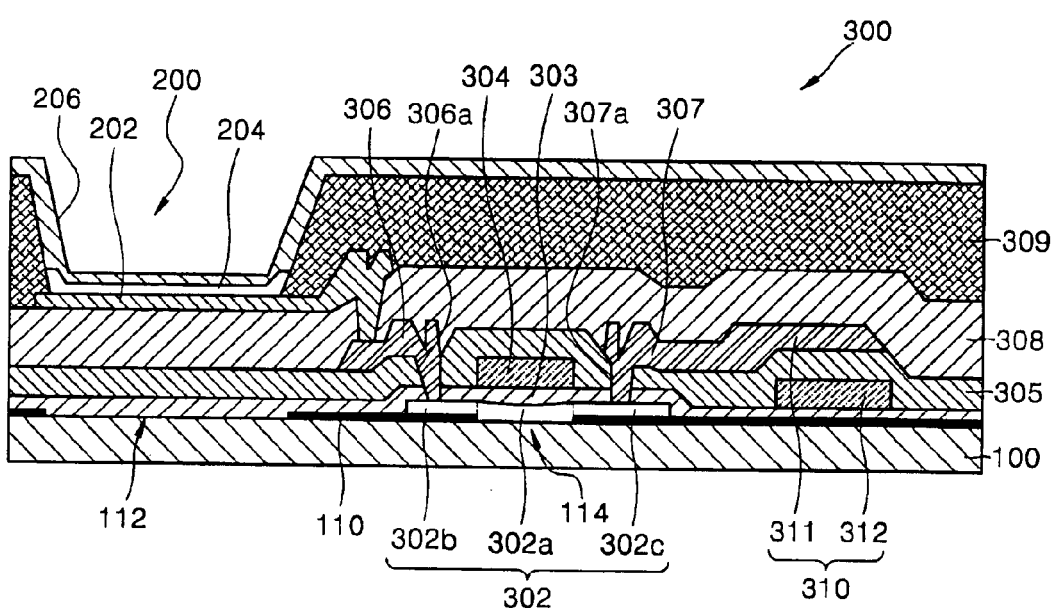
FIG. 9 is a sectional view of an organic light emitting display according to an embodiment of the present invention, in which a thin film transistor is formed using a crystallization method of the present invention.

FIG. 9 illustrates an active matrix organic light-emitting display (AMOLED) using a TFT formed by the above-described method, according to an embodiment of the present invention.

Referring to FIG. 9, a pixel region 200 including transparent pixel electrodes and a driving region 300 including a TFT and a capacitor are formed on a transparent substrate 100. An additionally buffer layer (not shown) formed of $SiO_x$ (x≧1) or $SiN_x$ (x≧1) may be formed directly on a top surface of the substrate 100.

In the driving region 300, a semiconductor active layer 302 is formed of a polysilicon thin film as a predetermined pattern on the top surface of the substrate 100, and a gate dielectric layer 303 is formed to cover the semiconductor active layer 302. A gate electrode layer 304 is formed on the gate dielectric layer 303, above the semiconductor active layer 302, and an interlayer insulating layer 305 is formed to cover the gate electrode layer 304. Contact holes 306a and 307a are formed through the interlayer insulating layer 305 and the gate dielectric layer 303, and a drain electrode 306 and a source electrode 307 formed on the interlayer insulating layer 305 are connected to a drain region 302b and a source region 302c of the semiconductor active layer 302, respectively, via the contact holes 306a and 307a. A capacitor 310 including a first electrode 311 and a second electrode 312 with the interlayer insulating layer 305 interposed therebetween is formed in the driving region 300, wherein the first electrode 311 is connected to the source electrode 307.

A passivation layer 308 is formed over the TFT and the capacitor 310 of the driving region 300 and the pixel region 200, and a planarization layer 309 is formed thereon with an opening exposing the pixel region 200. A transparent electrode 202 electrically connected to the drain electrode 306 of the TFT lies under the opening of the planarization layer 309. An organic layer 204 is deposited on the transparent electrode 202, and a cathode layer 206 is formed on the organic layer 204 and the entire surface of the planarization layer 309.

In the display described above, a black matrix layer 110 which blocks an external light reflection is formed directly on a surface of the substrate 100. This black matrix layer 110 has a predetermined pattern with an opening 112 below the pixel region 200 and an opening 114 below a channel region 302a of the semiconductor active layer 302, as illustrated in FIG. 9. The opening 112 allows light to pass through the pixel region 200, and the opening 114 induces lateral crystallization from the channel region 302a to form a MILC region. The opening 112 which exposes the pixel region 200 of the display and the opening 114 which exposes the channel region 302a of the TFT can be simultaneously formed through a single patterning operation, so as to simplify the overall manufacturing operation.

The crystallization method of amorphous silicon according to the present invention described above is also compatible with a Cr/CrO$_x$ thin film, which is commonly used to form a black matrix of displays.

Figure 10:
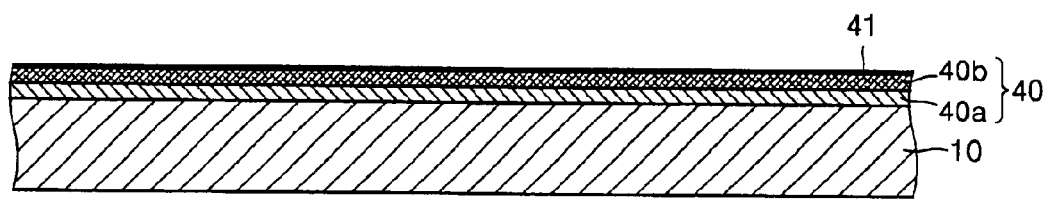
FIGS. 10 through 12 are sectional views illustrating a crystallization method of an amorphous silicon thin film according to another embodiment of the present invention.
Figure 11:
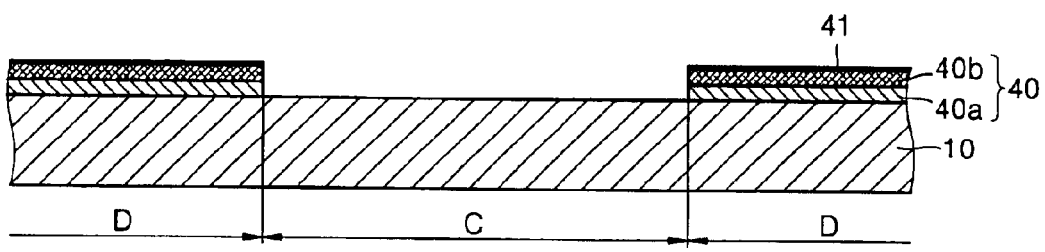
Figure 12:
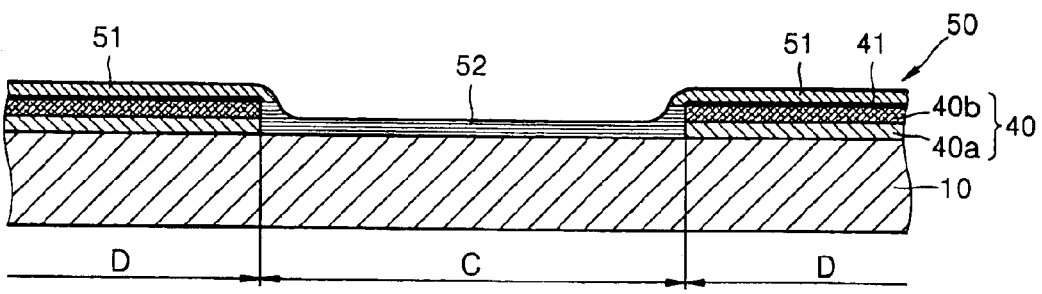

FIGS. 10 through 12 illustrate a crystallization method of amorphous silicon according to another embodiment of the present invention.

Referring to FIG. 10, a first thin film 40a of, for example, CrO$_x$ (x≧1) and a second thin film 40b of, for example, Cr are formed on an insulating substrate 10 as a functional thin film 40. The functional thin film 40 can be used as a black matrix. Due to the second thin film 40b being formed of Cr, there is no need to form an additional crystallization thin film on the functional thin film 40. However, a catalyst, for example, Ni or Pb, which is more effective for silicon crystallization, may be incorporated into an upper region of the second thin film 40b. Also, a crystallization thin film 41 having such a silicon crystallization catalyst may be additionally formed on a surface of the second thin film 40b. In addition, an additional buffer layer formed of, for example, SiO$_x$ (x≧1) or SiN$_x$, (x≧1) may be formed between the substrate 10 and the first thin film 40a.

The formation of the functional thin film 40 is followed by a patterning, as illustrated in FIG. 11. Where the functional thin film 40 is used as an external light absorbing layer for a display, this patterning process may be performed simultaneously with a patterning to expose a pixel region of the display. As a result, the display can be manufactured with fewer manufacturing operations, as described above.

As a result of the patterning, the functional thin film 40 has a patterned region C and a non-patterned region D. Since the functional thin film 40 does not have a concentration gradient profile in a direction of its thickness, unlike the previous embodiment, a sloping region is not formed at a boundary between the patterned region C and the non-patterned region D. Rather, a sharp step exists between the patterned region C and the non-patterned region D due to a difference in etch rate between CrO$_x$ (x≧1) of the first thin film 40a and Cr of the second thin film 40b. Such a step between the patterned region C and the non-patterned region D may be intentionally induced.

Next, an amorphous silicon thin film 50 is formed on the pattern region C and the non-patterned region D of the functional thin film 40, as illustrated in FIG. 12, and subjected to a thermal process for crystallization. As a result, an MIC region 51 is formed in the non-patterned region D due to the crystallization of the amorphous silicon thin film 50 induced by the Cr or a silicon crystallization catalyst in the first thin film 40b or by the crystallization thin film 41. In addition, a MILC region 52 is formed in the patterned region D due to the lateral crystallization from the MIC region 51. In this embodiment, a MIC and MILC combined region is not formed, unlike the previous embodiment. However, a small extent of the MIC and MILC combined region may exist depending on the step resulting at the boundary between the patterned region C and the non-patterned region D after the deposition of the amorphous silicon thin film 50.

After the polysilicon thin film is formed, while not illustrated, a channel region may be defined at a center region of the MILC region 52, and a source region and a drain region may be defined at a peripheral region of the MILC region 52 and the MIC region 51, wherein the channel region, the source region, and the drain region form a semiconductor active layer. To provide a complete TFT, while not illustrated, a gate dielectric layer and a gate electrode are formed on the semiconductor active layer, followed by implanting a high concentration of impurity ions into the source and drain regions, as described above with respect to FIG. 9.

Although not illustrated in the drawings, a single Cr or CrO$_x$ layer, in addition to a combination of Cr and CrO$_x$ layers as described above, or a general graphite black matrix can be used as a black matrix. In the case of using a general graphite black matrix, a silicon crystallization catalyst is incorporated into an upper region of the graphite black matrix, or an additional crystallization thin film is formed on the graphite black matrix. In addition, graphitic substances for a black matrix require thermal durability at the crystallization temperature.

According to the present invention, an amorphous silicon thin film can be crystallized using a black matrix layer in a simpler manner, as described above, thereby eliminating complicated operations to define a channel region in an MILC region. In addition, a region defining a MILC region of a TFT and a region exposing pixels of a display can be defined in the black matrix through a single patterning operation, thus reducing the number of required manufacturing operations.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A crystallization method of an amorphous silicon thin film, the method comprising:
    forming a black matrix layer to absorb external light on a substrate, an upper region of the black matrix layer having a catalyst for crystallization;
    patterning the black matrix layer;
    forming the amorphous silicon thin film on the substrate and the black matrix layer; and
    thermally processing the amorphous silicon thin film for crystallization.

2. The crystallization method of claim 1, wherein:
    the forming of the black matrix layer comprises forming a functional thin film having a transparent first component in a lower region thereof facing the substrate and a metallic second component in an upper region thereof, and
    the forming of the functional thin film includes forming the transparent first component having a gradually decreasing concentration and the metallic second component having a gradually increasing concentration, with increasing distance from the substrate.

3. The crystallization method of claim 2, wherein the transparent first component comprises at least one selected from the group consisting of $SiO_x$ where $x \geq 1$, $SiN_x$ where $x \geq 1$, $MgF_2$, $CaF_2$, $Al_2O_3$, and $SnO_2$, and the group consisting of ITO, IZO, ZnO, and $In_2O_3$.

4. The crystallization method of claim 2, wherein the metallic second component comprises at least one metal selected from the group consisting of Fe, Co, V, Ti, Al, Ag, Si, Ge, Y, Zn, Zr, W, Ta, Cu, and Pt.

5. The crystallization method of claim 1, wherein the black matrix layer comprises a $CrO_x$ thin film where $x \geq 1$, or a Cr thin film.

6. The crystallization method of claim 1, wherein the forming of the black matrix layer comprises:
  forming a functional thin film having a first thin film formed of $CrO_x$, where $x \geq 1$, on the substrate; and
  forming a second thin film formed of Cr on the first thin film.

7. The crystallization layer of claim 1, wherein:
  the black matrix layer is for a flat panel display, and
  the patterning of the black matrix layer comprises patterning the black matrix layer simultaneously with a patterning operation to expose a pixel region of the flat panel display.

8. The crystallization method of claim 1, wherein the catalyst is a catalyst for silicon crystallization comprising at least one selected from the group consisting of Ni, Pd, Au, Sn, Sb, Cr, Mo, Tr, Ru, Rh, Fe, Co, V, Ti, Al, Ag, Cu, and Pt.

9. A crystallization method of an amorphous silicon thin film, the method comprising:
  forming a black matrix layer to absorb external light on a substrate;
  forming a crystallization thin film having a catalyst for crystallization on the black matrix layer;
  patterning the black matrix layer and the crystallization thin film;
  forming the amorphous silicon thin film on the substrate and the patterned crystallization thin film; and
  thermally processing the amorphous silicon thin film for crystallization.

10. The crystallization method of claim 9, wherein:
  the forming of the black matrix layer comprises forming a functional thin film having a transparent first component in a lower region thereof facing the substrate and a metallic second component in an upper region thereof, and
  the forming of the functional thin film includes forming the transparent first component having a gradually decreasing concentration and the metallic second component having a gradually increasing concentration, with increasing distance from the substrate.

11. The crystallization method of claim 10, wherein the transparent first component comprises at least one selected from the group consisting of $SiO_x$ where $x \geq 1$, $SiN_x$ where $x \geq 1$, $MgF_2$, $CaF_2$, $Al_2O_3$, and $SnO_2$, and the group consisting of ITO, IZO, ZnO, and $In_2O_3$.

12. The crystallization method of claim 10, wherein the metallic second component comprises at least one metal selected from the group consisting of Fe, Co, V, Ti, Al, Ag, Si, Ge, Y, Zn, Zr, W, Ta, Cu, and Pt.

13. The crystallization method of claim 9, wherein the black matrix layer comprises a $CrO_x$ thin film where $x \geq 1$, or a Cr thin film.

14. The crystallization method of claim 9, wherein the forming of the black matrix layer comprises:
  forming a functional thin film having a first thin film formed of $CrO_x$, where $x \geq 1$, on the substrate; and
  forming a second thin film formed of Cr on the first thin film.

15. The crystallization method of claim 9, wherein:
  the black matrix layer is for a flat panel display, and
  the patterning the black matrix layer comprises patterning the black matrix layer simultaneously with a patterning operation to expose a pixel region of the flat panel display.

16. The crystallization method of claim 9, wherein the catalyst is a catalyst for silicon crystallization comprising at least one selected from the group consisting of Ni, Pd, Au, Sn, Sb, Cr, Mo, Tr, Ru, Rh, Fe, Co, V, Ti, Al, Ag, Cu, and Pt.

17. A thin film transistor comprising:
  a substrate;
  a semiconductor active layer having channel, source and drain regions formed on the substrate, wherein:
    the source and drain regions are formed at respective sides of the channel region, and
    at least the channel region is formed as a metal-induced lateral crystallization (MILC) region;
  a black matrix layer interposed between the substrate and at least the source region and the drain region of the semiconductor active layer, wherein an upper region of the black matrix layer includes a catalyst for crystallization;
  a gate dielectric layer formed on the channel region; and
  a gate electrode formed on a gate dielectric layer.

18. The thin film transistor of claim 17, wherein:
  the black matrix layer is a functional thin film having a transparent first component in a lower region thereof facing the substrate and a metallic second component in an upper region thereof, and
  the transparent first component has a gradually decreasing concentration and the metallic second component has a gradually increasing concentration, with increasing distance from the substrate.

19. The thin film transistor of claim 18, wherein the transparent first component comprises at least one selected from the group consisting of $SiO_x$ where $x \geq 1$, $SiN_x$ where $x \geq 1$, $MgF_2$, $CaF_2$, $Al_2O_3$, and $SnO_2$, which are transparent insulating materials, and the group consisting of ITO, IZO, ZnO, and $In_2O_3$, which are transparent conductive materials.

20. The thin film transistor of claim 18, wherein the metallic second component comprises at least one metal selected from the group consisting of Fe, Co, V, Ti, Al, Ag, Si, Ge, Y, Zn, Zr, W, Ta, Cu, and Pt.

21. The thin film transistor of claim 17, wherein the black matrix layer comprises a $CrO_x$ thin film where $x \geq 1$, or a Cr thin film.

22. The thin film transistor of claim 17, wherein the black matrix layer is a functional thin film comprising a first thin film formed of $CrO_x$, where $x \geq 1$, on the substrate and a second thin film formed of Cr on the first thin film.

23. The thin film transistor of claim 17, wherein the catalyst is a catalyst for silicon crystallization comprising at least one selected from the group consisting of Ni, Pd, Au, Sn, Sb, Cr, Mo, Tr, Ru, Rh, Fe, Co, V, Ti, Al, Ag, Cu, and Pt.

24. The thin film transistor of claim 17, wherein the black matrix layer slopes downward from the source region and the drain region toward the channel region.

25. The thin film transistor of claim 24, wherein:
  each of the source region and the drain region includes a combined region facing the channel region and a metal-induced crystallization (MIC) region, and
  the combined region includes a portion of the MILC region and a portion of the MIC region.

26. The thin film transistor of claim 17, further comprising a silicon crystallization catalyst thin film comprising at least one metal selected from the group consisting of Ni, Pd, Au, Sn, Sb, Cr, Mo, Tr, Ru, Rh, Fe, Co, V, Ti, Al, Ag, Cu, and Pt, which is provided between the black matrix layer and the source and drain regions.

27. A flat panel display comprising:
  an insulating substrate;
  a pixel region including pixels arranged in a matrix on the insulating substrate; and
  at least one thin film transistor near the pixel region, wherein the at least one thin film transistor comprises:
    a semiconductor active layer having channel, source and drain regions fromed on the insulating substrate, the source and drain regions formed at respective sides of the channel region, wherein at least the channel region is formed as a metal-induced lateral crystallization (MILC) region,
    a gate dielectric layer formed above the channel region,
    a gate electrode formed on the gate dielectric layer, and
    a black matrix layer interposed between the insulating substrate and the gate dielectric layer, the black matrix layer having an opening which exposes at least the channel region between the source region and the drain region of the semiconductor active layer and an opening which exposes the pixel region.

28. The flat panel display of claim 27, wherein the black matrix layer slopes downward from the source region and the drain region toward the channel region.

29. The flat panel display of claim 28, wherein:
  each of the source region and the drain region includes a combined region facing the channel region and a metal-induced crystallization (MIC) region, and
  the combined region includes a portion of the MILC region and a portion of the MIC region.

30. The flat panel display of claim 27, wherein an upper region of the black matrix layer facing the semiconductor active layer comprises at least one metal selected from the group consisting of Ni, Pd, Au, Sn, Sb, Cr, Mo, Tr, Ru, Rh, Fe, Co, V, Ti, Al, Ag, Cu, and Pt.

31. The flat panel display of claim 27, further comprising a silicon crystallization catalyst thin film comprising at least one metal selected from the group consisting of Ni, Pd, Au, Sn, Sb, Cr, Mo, Tr, Ru, Rh, Fe, Co, V, Ti, Al, Ag, Cu, and Pt, which is provided between the black matrix layer and the source and drain regions of the semiconductor active layer.

32. The thin film transistor of claim 17, wherein the black matrix layer is a functional thin film having a transparent first component in a lower region thereof facing the substrate and a metallic second component in an upper region thereof, except an area of the functional thin film underneath the channel region does not comprise the metallic second component.

33. The thin film transistor of claim 17, wherein the back matrix comprises a plurality of thin films which are sequentially stacked in an order of their refractive indices so as to increasingly vary a light absorption coefficient of the black matrix along a thickness thereof.

34. The thin film transistor of claim 25, wherein the MIC region and the MILC region are formed to be continuous without a definite boundary therebetween.

35. The flat panel display of claim 27, wherein the flat panel display further comprises:
  an interlayer insulating layer formed on the gate electrode and the gate dielectric layer;
  source and drain electrodes which are formed on the interlayer insulating layer and electrically connected to the source and drain regions, respectively, of the semiconductor active layer; and
  a passivation layer formed on the interlayer insulating layer, the source electrode, and the drain electrode so as to connect a pixel electrode of the pixel region to the drain electrode.

36. The flat panel display of claim 27, wherein the opening which exposes the at least the channel region and the opening which exposes the pixel region are simultaneously formed through a single patterning operation.

* * * * *